United States Patent
Schuermann

(10) Patent No.: US 11,415,537 B2
(45) Date of Patent: Aug. 16, 2022

(54) MEMS GAS SENSOR HAVING A MEDIA-SENSITIVE MATERIAL

(71) Applicant: Robert Bosch GmbH, Stuttgart (DE)

(72) Inventor: Gregor Schuermann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 414 days.

(21) Appl. No.: 16/617,856

(22) PCT Filed: May 16, 2018

(86) PCT No.: PCT/EP2018/062765
§ 371 (c)(1),
(2) Date: Nov. 27, 2019

(87) PCT Pub. No.: WO2018/219651
PCT Pub. Date: Dec. 6, 2018

(65) Prior Publication Data
US 2020/0182817 A1     Jun. 11, 2020

(30) Foreign Application Priority Data
Jun. 1, 2017 (DE) .......................... 102017209269.6

(51) Int. Cl.
*G01N 27/12* (2006.01)
*B81C 1/00* (2006.01)

(52) U.S. Cl.
CPC ....... *G01N 27/128* (2013.01); *B81C 1/00206* (2013.01); *G01N 27/125* (2013.01); *B81B 2201/0214* (2013.01)

(58) Field of Classification Search
CPC .............. B81C 1/00206; G01N 27/128; G01N 27/125; B81B 2201/0214
See application file for complete search history.

(56) References Cited

U.S. PATENT DOCUMENTS

2006/0249384 A1   11/2006   Kim et al.
2017/0370864 A1*  12/2017   Samarao .............. G01N 27/121

FOREIGN PATENT DOCUMENTS

| EP | 3115775 | A2 | 1/2017 | |
| GB | 2183344 | A * | 6/1987 | ............ C12Q 1/001 |
| JP | S6283641 | A | 4/1987 | |
| JP | H03251755 | A | 11/1991 | |
| JP | H055713 | A | 1/1993 | |

(Continued)

OTHER PUBLICATIONS

International Search Report for PCT/EP2018/062765, dated Aug. 16, 2018.

(Continued)

*Primary Examiner* — Eric S. McCall
*Assistant Examiner* — Timothy P Graves
(74) *Attorney, Agent, or Firm* — Norton Rose Fulbright US LLP; Gerard Messina

(57) ABSTRACT

A MEMS media sensor, in particular, a MEMS gas sensor, including at least two electrodes, which are situated electrically isolated from one another with the aid of a carrier layer, a media-sensitive material for electrically connecting the two electrodes being applied to the carrier layer, a surface area for applying the media-sensitive material on the carrier layer having a topography, which is adapted to a particle size of particles of the media-sensitive material.

10 Claims, 4 Drawing Sheets

(56) References Cited

FOREIGN PATENT DOCUMENTS

| JP | H0792123 A | | 4/1995 | |
|---|---|---|---|---|
| KR | 20090075036 A | * | 7/2009 | ............. G01N 27/12 |
| WO | 2016109434 A1 | | 7/2016 | |

OTHER PUBLICATIONS

Bhattacharyya, et al.: "A Low Power MEMS Gas Sensor Based on Nanocrystalline ZnO Thin Films for Sensing Methane", Microelectronics Reliability, 48 (2008), pp. 1772-1779.

Kim, et al.: "Thermochemical Hydrogen Sensor Based on Pt-Coated Nanofiber Catalyst Deposited on Pyramidally Textured Thermoelectric Film", Applied Surface Science, 415 (5), (2016), pp. 119-125.

* cited by examiner

RELATED ART

MEMS GAS SENSOR HAVING A MEDIA-SENSITIVE MATERIAL

FIELD

The present invention relates to a MEMS media sensor, in particular, a MEMS gas sensor, including at least two electrodes, which are situated electrically isolated from one another with the aid of a carrier layer, a fluid-sensitive material for electrically connecting the two electrodes being applied to the carrier layer.

The present invention further relates to a method for applying a material to a carrier layer.

The present invention, although it is applicable to arbitrary media, is explained with reference to gas as a medium.

BACKGROUND INFORMATION

Conventional gas sensors use gas-sensitive layers between two electrodes, which change their property, for example, their electrical resistance, when contacting a gas to be measured. In the process, the measuring signal is formed as a result of adsorption of the gases on the surface of the gas-sensitive layer and, if this layer contains particles, on interfaces between particles in the material of the gas-sensitive layer. As a result of this, the electrical resistance of the gas-sensitive layer between the two electrodes is changed, for example. The degree of homogeneity of the size distribution of these particles and their spatial distribution between the two electrodes influence the current path and, therefore, the measuring signal of the gas sensor.

In one specific embodiment, the present invention provides a MEMS media sensor, in particular a MEMS gas sensor, including at least two electrodes, which are situated electrically isolated from one another with the aid of a carrier layer, a media-sensitive material for electrically connecting the two electrodes being applied to the carrier layer, a surface area of the carrier layer for forming the gas-sensitive layer for applying the media-sensitive material having a topography, which is adapted to a particle size of particles of the media-sensitive material.

In another specific embodiment, the present invention provides a method for applying a material to a carrier layer, an area of the carrier layer being structured with a topography, which is adapted to a particle size of particles of the material to be applied before the application of the material.

One of the advantages achieved thereby is that a homogenous particle distribution of the particles on the carrier layer is achieved, in particular, also when the media-sensitive material itself exhibits no size distribution optimal for a particular application, or when the material for the carrier layer exhibits a wide variation in the particle size of similar particles.

In other words, the present invention allows for the application of media-sensitive material, the surface on which the media-sensitive material is to be applied being structured two-dimensionally or three-dimensionally before the application of the media-sensitive material in such a way that the media-sensitive material is distributed as homogenously as possible. This is achieved in that a topography adapted to the particle size is formed in the area on which the media-sensitive material is to be applied, i.e., the area is two-dimensionally or three-dimensionally structured.

A further advantage is that capillary forces, for example, which result in the accumulation of large particles in the middle of the applied media-sensitive material, may thus be counteracted during the drying of the media-sensitive material. This results in a more homogenous and reproducible mixing of particles of the material. Another advantage is that media sensors having defined and reproducible properties are manufacturable as a result.

The term "MEMS sensor" is understood to mean a micromechanical sensor.

The term "medium" is understood to mean a material, a substance or the like. The term "medium" includes, in particular, fluids, i.e., liquids and gases.

The term "topography" is to be understood in the broadest sense and refers, in particular, in the claims, preferably in the description, to a two-dimensional or three-dimensional structure.

The term "size" with respect to particles is to be understood in the broadest sense and refers, in particular, in the claims, preferably in the description, to an average diameter of particles, for example. The term "size" may, however, also refer to any type of measure for describing the size of the particles, for example, volume, surface, circumference or the like, or to general parameters for the geometric dimensions of the particle.

The term "height" is to be understood in the broadest sense and refers, in particular, in the claims, preferably in the description, to an extent, spacing or distance or the like measured from a surface in the vertical direction.

The term "essentially" is to be understood in the broadest sense and refers, in particular, in the claims, preferably in the description, to deviations, variations, tolerances, etc. in relation to dimensions, positions, spacings, distances, fractions or the like. For example, the expression "one size is essentially identical to a second size" indicates that the two sizes may deviate from one another, in particular, by 100%, preferably by 75%, in particular, by 50%, preferably by at least 25%, in particular, by 20%, preferably by 10%, in particular, at least 0.5% preferably less than 0.1%, in particular, less than 0.001% or the like.

Additional advantages, refinements and additional specific embodiments of the present invention are described below or become apparent as a result:

According to one advantageous refinement, the carrier layer is made of a dielectric material. One of the advantages achieved thereby is that the at least two electrodes may thus be electrically isolated from one another in a simple and reliable manner.

According to another advantageous refinement, the topography is formed by periodic and/or aperiodic elevations and/or depressions of the carrier layer. An example of aperiodic irregularities—elevations and depressions—is a roughened surface of the carrier layer. An example of periodic elevations is a comb-like structure. One of the advantages achieved thereby is that an adaptation of the topography to a particle size of particles of the media-sensitive material may thus be achieved in a simple manner. Moreover, the surface may be roughened particularly simply and quickly.

According to another advantageous refinement, the media-sensitive material includes particles of at least two different particle sizes. As a result, the media-sensitive material may be simply and cost-efficiently provided in the form of a paste that includes solid particles.

According to another advantageous refinement, the topography of the carrier layer is formed by periodic elevations and the spacing of the periodic elevations corresponds essentially to the size of the larger particles and/or the periodic elevations are designed in such a way that their height in total with the diameter of the smaller particles corresponds essentially to the diameter of the larger particles. A particularly homogenous distribution of large and small particles of the media-sensitive material is achieved as a result. The current path between the two electrodes is also improved, since the number of particle transitions becomes greater, so that the sensitivity and reproducibility of the sensitivity between different media sensors are improved.

According to another advantageous refinement, the topography is designed in such a way that particles having the same particle size are situated essentially in the same plane, and particles having different particle sizes are situated in different planes. As a result, a layer structure having particles of different sizes may essentially be achieved, for example.

According to another advantageous refinement, the topography is designed in such a way that, starting from the carrier layer, particles having a larger particle size are situated above particles having a smaller particle size. As a result, a period of the topography may, for example, be selected in such a way that the larger particles get "caught" between the individual elevations on the surface of a comb-like structure/topography. A measuring current then flows along the path having the fewest particle interfaces or particle transitions. Another advantage is that the effect of the smaller particles on the signal path for the measuring signal may be minimized as a result.

According to another advantageous refinement, the media-sensitive material includes a mixture of solid particles such as metal oxides or the like, in particular, the media-sensitive material being present as a paste. Thus, a media-sensitive material, as well as a simple application capability and handling capability, may be provided in a simple manner.

Additional features and advantages of the present invention result from the figures and the description herein.

It is understood that the features described above and those explained below are applicable not only in each specified combination, but also in other combinations or alone, without departing from the scope of the present invention.

Preferred designs and specific embodiments of the present invention are depicted in the figures and are explained in greater detail below, identical reference numerals referring to identical or similar or functionally identical components or elements.

DETAILED DESCRIPTION OF EXAMPLE EMBODIMENTS

Figure 1:
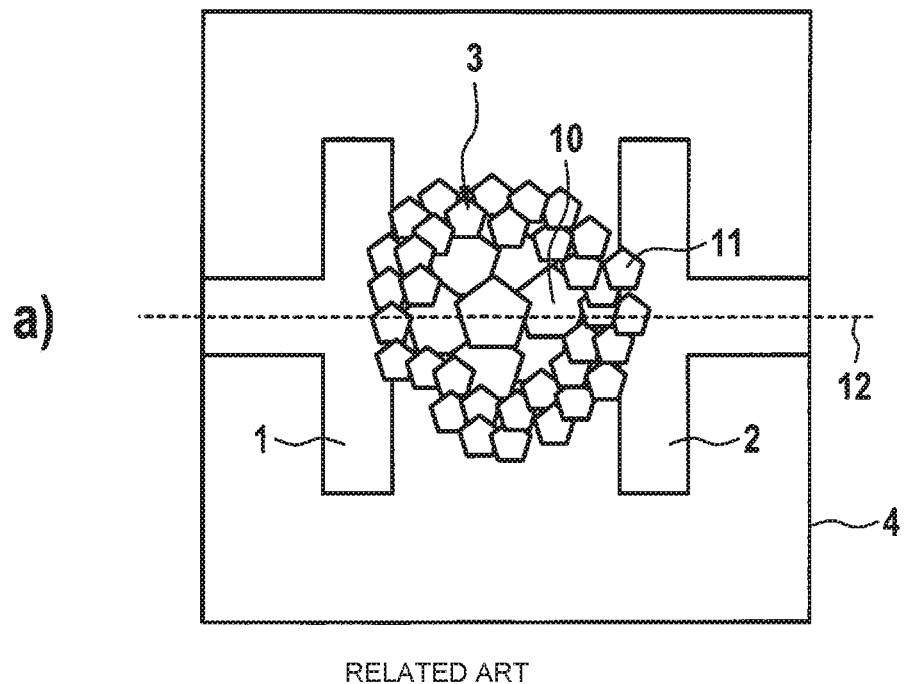
FIGS. 1a), b) schematically show an a MEMS gas sensor according to the related art.
Figure 1:
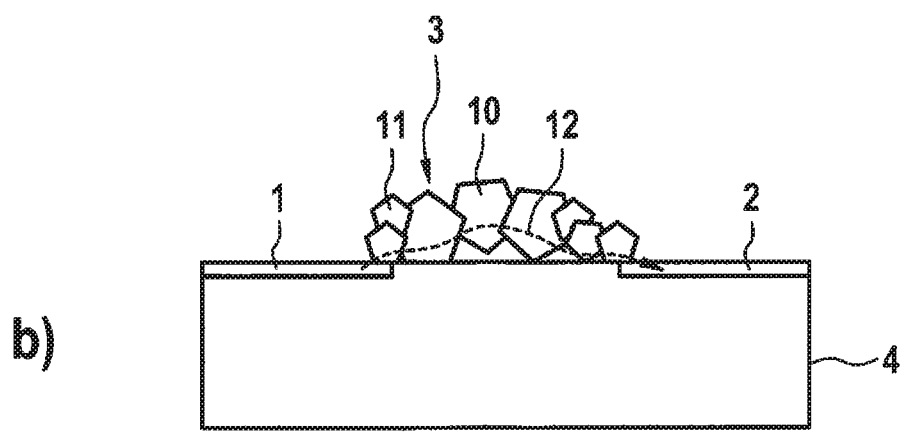

FIGS. 1a) and 1b) show a MEMS gas sensor according to the related art.

Reference numeral 1 in FIGS. 1a) and 1b) refers to a first electrode and reference numeral 2 refers to a second electrode of a MEMS gas sensor, which are situated on a carrier layer 4. Electrodes 1, 2 are conductively connected with the aid of a gas-sensitive paste 3, the resistance of which changes in the presence of a particular gas. Gas-sensitive paste 3 in this case includes particles having two different particle sizes—smaller solid particles 11 and larger solid particles 10. FIG. 1a) shows a top view from above and FIG. 1b) shows a cross sectional representation of the MEMS gas sensor. The electrical resistance of gas-sensitive paste 3 is measured via the two electrodes 1, 2. This resistance changes with the adsorption of gas molecules on the interfaces between adjacent solid particles 10, 11 in gas-sensitive paste 3.

The spatial distribution of variously sized particles 10, 11 of gas-sensitive paste 3 is not homogenous in FIGS. 1a) and 1b), since large particles 11 are situated in the center, for example, as a result of capillary forces during the drying of gas-sensitive paste 3. Since the measured resistance and the gas sensitivity of the MEMS gas sensor is a function, in particular, of the number of particle transitions, a wide variation in the properties of the MEMS gas sensor results along current path 12 in FIGS. 1a), 1b). In other words, the sensitivity of the MEMS gas sensor is low as a result of the inhomogeneous particle distribution and fluctuates strongly from sensor to sensor during the manufacture of such sensors.

Figure 2:
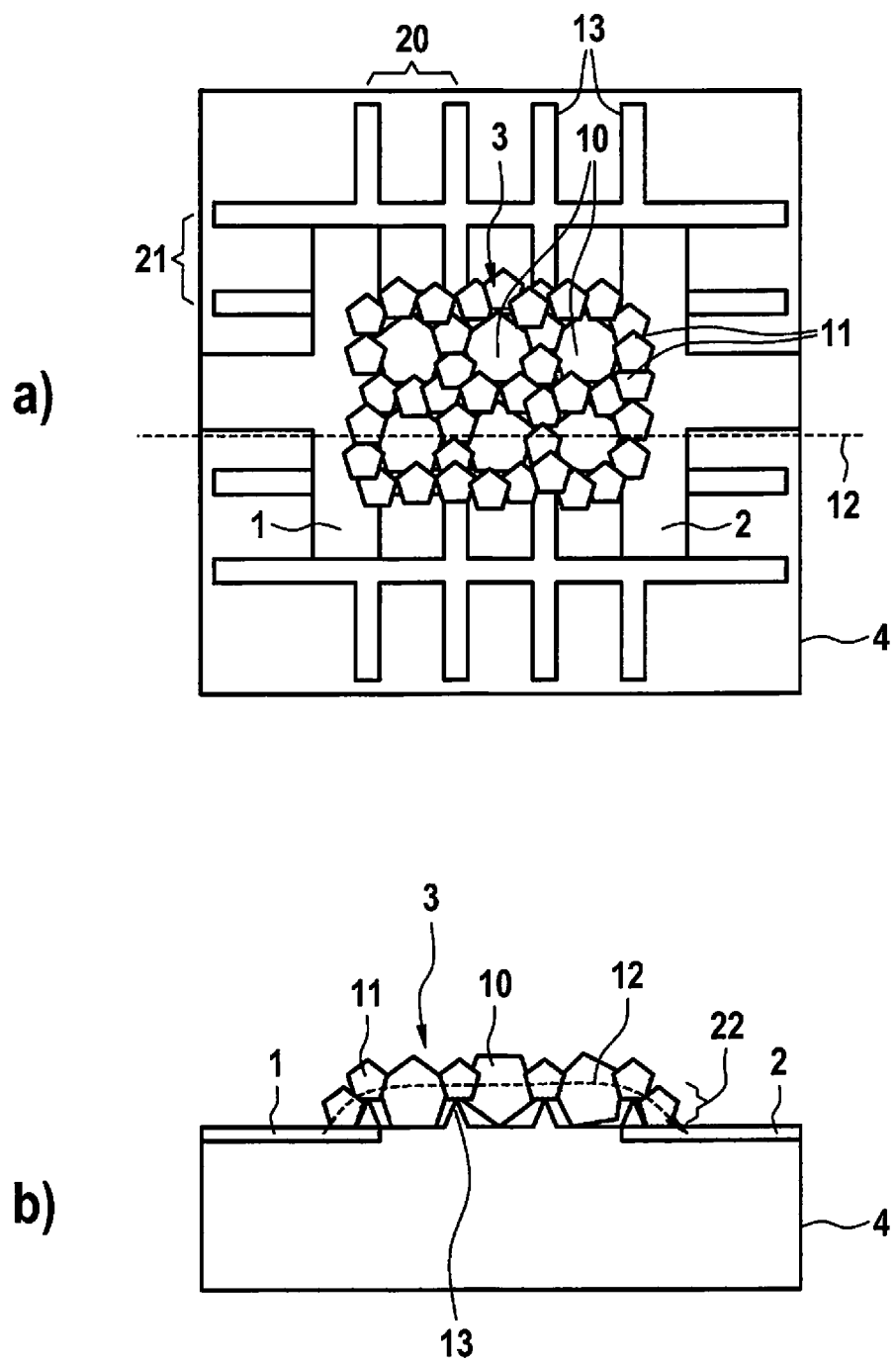
FIGS. 2a), b) schematically show a MEMS gas sensor according to a first specific embodiment of the present invention.

FIGS. 2a), 2b) show a MEMS gas sensor according to a first specific embodiment of the present invention.

In FIGS. 2a) and 2b), the surface of carrier layer 4 is now provided with a three-dimensional structure 13 between the two electrodes 1, 2. The advantage in this case is that the size distribution of particles 10, 11 of gas-sensitive paste 3 may be better controlled after the application process and the drying. A three-dimensional, periodic structure 13 may be structured with the aid of photolithography on a substrate between electrodes 1, 2, specifically into the surface of carrier layer 4 or also, for example, in the form of an additional dielectric layer 13. Periods 20, 21, amplitude 22 and form of periodic structure 13 may be adapted to the size distribution of particles 10, 11 in gas-sensitive paste 3 in such a way that an as homogenous as possible distribution of the particle sizes results after drying.

According to FIGS. 2a) and 2b), larger particles 12 arrange themselves between periodic elevations 13, whereas smaller particles 11 are localized essentially on periodic elevations 13. Overall, as is seen in the overview of FIG. 2a), an extremely homogenous distribution of large particles 10 and small particles 11 of gas-sensitive paste 3 is achieved. Periodic structure 13 in this case is made of a non-conductive material, for example, a dielectric material. As a result, current path 12 or the number of particle transitions between smaller and larger particles 10, 11 becomes greater overall than in a non-structured surface according to FIGS. 1a), 1b). One advantage in this case is that the sensitivity and the reproducibility of the sensitivity of the MEMS gas sensors are improved.

Figure 3:
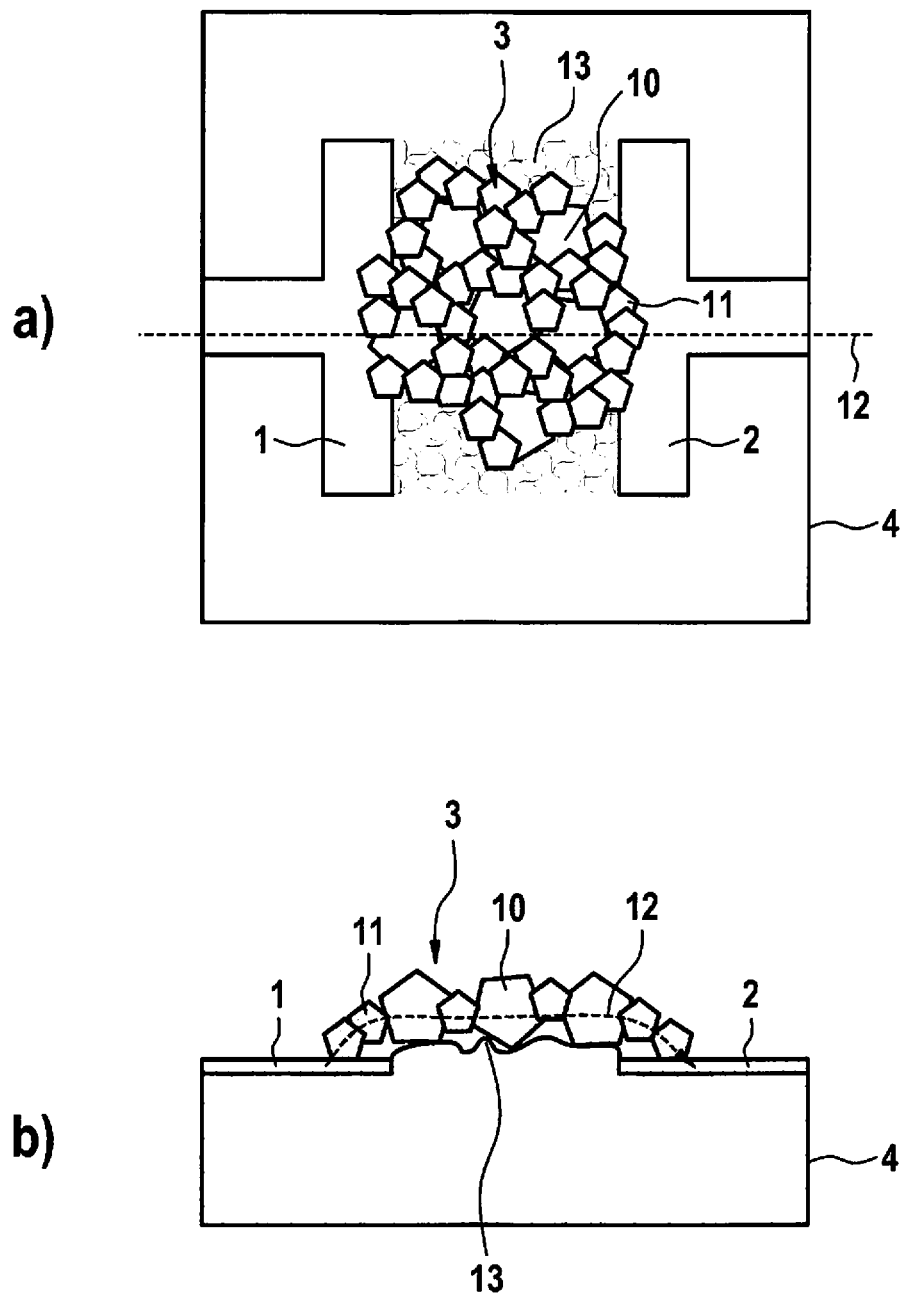
FIGS. 3a), b) schematically show a MEMS gas sensor according to a second specific embodiment of the present invention FIGS. 4a), b) schematically show a MEMS gas sensor according to a third specific embodiment of the present invention, Identical reference numerals in the figures refer to the same or functionally identical elements.

FIGS. 3a), 3b) show a MEMS gas sensor according to a second specific embodiment of the present invention.

FIGS. 3a), 3b) show essentially a MEMS gas sensor according to FIGS. 2a), 2b). In contrast to FIGS. 2a) and 2b), the surface of carrier layer 4 is purposefully roughened in FIGS. 3a) and 3b) (reference numeral 13) in order to achieve, similar to FIGS. 2a) and 2b), a homogenous size distribution of the particles, i.e., of larger particles 10 and of smaller particles 11. Similar to FIG. 2b), an improved current path between the two electrodes 1, 2 through the gas-sensitive paste 3 is shown in FIG. 3b). Periods 20, 21 and amplitude 22 are essentially random due to the roughening.

Figure 4:
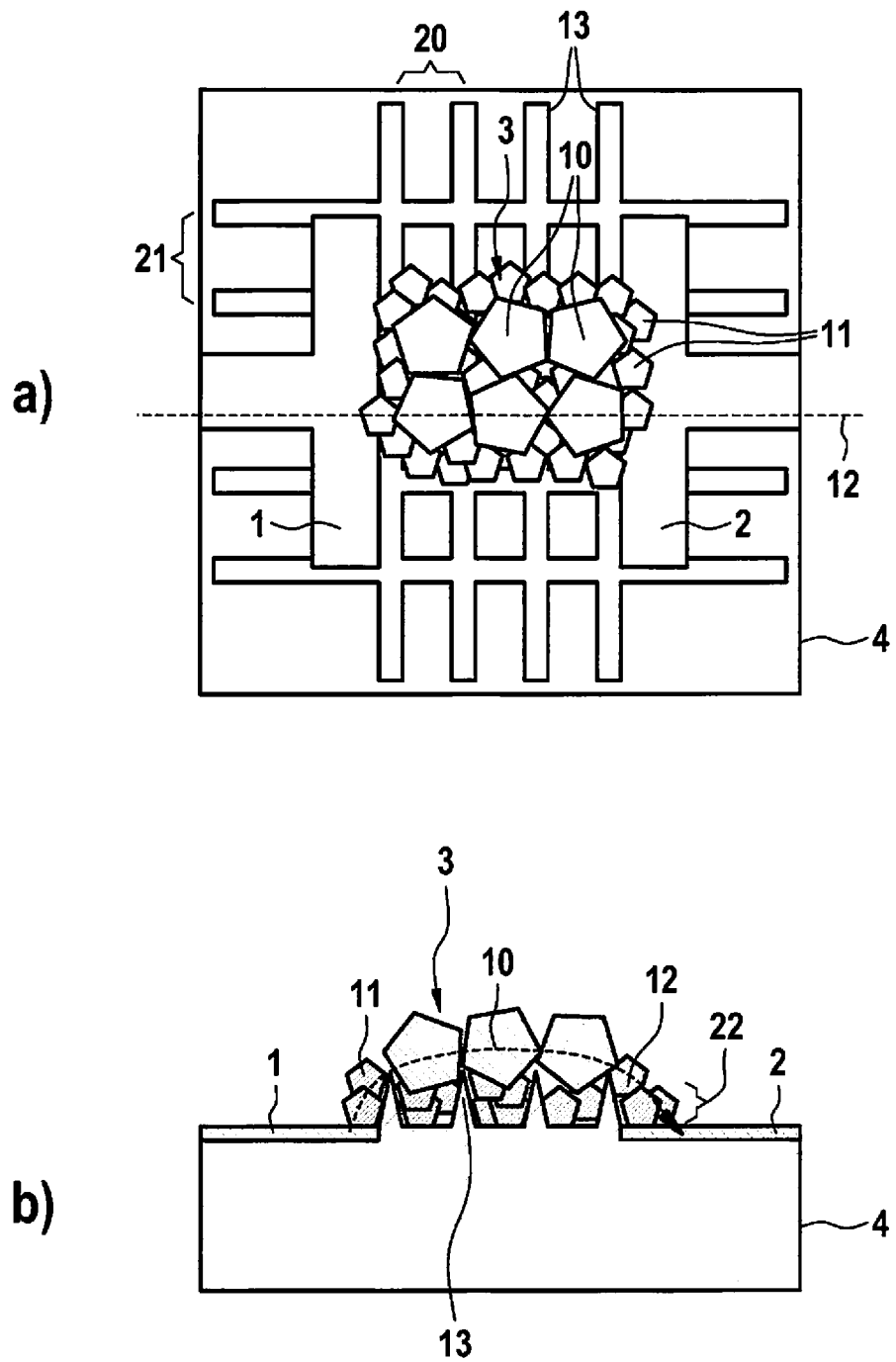

FIGS. 4a), 4b) show a MEMS gas sensor according to a third specific embodiment of the present invention.

FIGS. 4a) and 4b) show essentially a MEMS gas sensor according to FIGS. 2a) and 2b). In contrast to FIGS. 2a) and 2b), three-dimensional structure 13 in FIGS. 4a) and 4b) is designed in such a way that larger particles 10 and smaller particles 11 of gas-sensitive paste 3 are isolated or situated in different planes. To achieve this, periods 20, 21 and height 22 of the topography of three-dimensional structure 13 are selected in such a way that larger particles 10 are situated essentially above smaller particles 11. This may be achieved, for example, by an essentially comb-like, three-dimensional structure 13, as shown in FIGS. 4a) and 4b). Current path 12 thus selects the path having the fewest particle interface transitions and extends essentially through larger particles 10; the effect of smaller particles 11 of gas-sensitive paste 3 on current path 12 may be minimized as a result.

Thus, three-dimensional structure 13 in FIGS. 4a) and 4b) is simply designed in such a way that essentially only large particles 10 contribute to current path 12.

In summary, at least one specific embodiment of the present invention allows for at least one of the following advantages:

more homogeneous particle distribution,
reproducible properties of a sensor, in particular, of a MEMS gas sensor,
improved reproducibility of the sensitivity of a sensor,
better control of the size distribution of particles when applying on a carrier layer.

The present invention, although it has been described with reference to preferred exemplary embodiments, is not limited thereto, but is modifiable in a variety of ways.

What is claimed is:

1. A MEMS media sensor, comprising:
    at least two electrodes which are situated electrically isolated from one another using a carrier layer; and
    a media-sensitive material electrically connecting the two electrodes applied to the carrier layer, a surface area for applying the media-sensitive material on the carrier layer having a topography which is adapted to a distinct size of particles of the media-sensitive material, the particles of the media-sensitive material including particles of the distinct size of particles and other particles not having the distinct size, and those particles of the particles of the media-sensitive material having the same particle size as the distinct size of particles being situated in the same plane and those particles of the particles of the media-sensitive material having different particle sizes than the distinct size of particles being situated in different planes;
    wherein the topography is configured so that, starting from the carrier layer, smaller particles of the particles of the media-sensitive material form a layer of smaller particles deposited on the carrier layer and larger particles of the particles of the media-sensitive materials form a layer of larger particles deposited on the layer of smaller particles, sandwiching the layer of smaller particles between the carrier layer and the layer of larger particles.

2. The MEMS media sensor as recited in claim 1, wherein the MEMS media sensor is a MEMS gas sensor.

3. The MEMS media sensor as recited in claim 1, wherein the carrier layer is made of a dielectric material.

4. The MEMS media sensor as recited in claim 1, wherein the topography is formed by periodic and/or aperiodic elevations and depressions of the carrier layer.

5. The MEMS media sensor as recited in claim 1, wherein the media-sensitive material includes a mixture of solid particles.

6. The MEMS media sensor as recited in claim 5, wherein the media-sensitive material includes a mixture of metal oxides.

7. The MEMS media sensor as recited in claim 5, wherein the media-sensitive material is paste.

8. A MEMS media sensor, comprising:
    at least two electrodes which are situated electrically isolated from one another using a carrier layer; and
    a media-sensitive material electrically connecting the two electrodes applied to the carrier layer, a surface area for applying the media-sensitive material on the carrier layer having a topography which is adapted to a distinct size of particles of the media-sensitive material, the particles of the media-sensitive material including particles of the distinct size of particles and other particles not having the distinct size, and those particles of the particles of the media-sensitive material having the same particle size as the distinct size of particles being situated in the same plane and those particles of the particles of the media-sensitive material having different particle sizes than the distinct size of particles being situated in different planes;
    wherein the topography is formed by periodic and/or aperiodic elevations and depressions of the carrier layer, and
    wherein the topography of the carrier layer is formed by periodic elevations, and a spacing of the periodic elevations corresponds to a size of larger particles of the particles of the media-sensitive material and/or the periodic elevations are configured so that a height of the periodic elevations in total with a diameter of smaller particles of the particles of the media-sensitive material corresponds to a diameter of the larger particles.

9. A method for applying a media-sensitive material to a carrier layer, the method comprising:
    structuring an area of the carrier layer with a topography before the application of the media-sensitive material, the topography being adapted to a distinct size of particles of the media-sensitive material to be applied, the particles of the media-sensitive material includes particles of the distinct size of particles and other particles not having the distinct size, and those particles of the particles of the media-sensitive material having the same particle size as the distinct size of particles being situated in the same plane and those particles of the media-sensitive material having different particle sizes than the distinct size of particles being situated in different planes;
    wherein the topography is configured so that, starting from the carrier layer, smaller particles of the particles of the media-sensitive material form a layer of smaller particles deposited on the carrier layer and larger particles of the particles of the media-sensitive materials form a layer of larger particles deposited on the layer of smaller particles, sandwiching the layer of smaller particles between the carrier layer and the layer of larger particles.

10. The method as recited in claim 9, wherein the topography is configured with periodic elevations, a spacing between two elevations of the periodic elevations and/or a height of the periodic elevations being adapted to at least one size of the particles of the media-sensitive material.

\* \* \* \* \*